United States Patent [19]

Hori

[11] Patent Number: 4,607,368
[45] Date of Patent: Aug. 19, 1986

[54] OPTICAL SEMICONDUCTOR DEVICE

[75] Inventor: Ken-ichi Hori, Kawasaki, Japan

[73] Assignee: Fujitsu Limited, Kawasaki, Japan

[21] Appl. No.: 445,045

[22] Filed: Nov. 29, 1982

[30] Foreign Application Priority Data

Nov. 30, 1981 [JP] Japan ............................ 56-192578

[51] Int. Cl.⁴ ............................................. H01S 3/19
[52] U.S. Cl. ........................................ 372/45; 357/17;
357/19; 372/46; 372/50
[58] Field of Search ............... 372/45, 46, 50; 357/17,
357/19, 40

[56] References Cited

U.S. PATENT DOCUMENTS 4,359,774 11/1982 Olsen et al. ........................... 372/45

FOREIGN PATENT DOCUMENTS 2031444 1/1971 Fed. Rep. of Germany .
0098880 7/1980 Japan ................................... 357/19

OTHER PUBLICATIONS

H. Matsueda et al., "Integrated Optoelectronic Structure", Conference: *International Electron Devices Meeting*, Washington, D.C. USA Dec. 7-9, 1981, pp. 272-275.
Toshiba Review, "High-Performance GaP Green LED Display", Kasami et al., No. 102, Mar.-Apr. 1976, pp. 29-34.
Electronics Letters, "GaInAsP/InP Laser with Monolithically Integrated Monitoring Detector", vol. 16, No. 9, Apr. 24, 1980, pp. 342-343.

Primary Examiner—James W. Davie
Attorney, Agent, or Firm—Staas & Halsey

[57] ABSTRACT

An optical semiconductor device includes a plurality of light emitting elements, such as a semiconductor laser device, on the same semiconductor substrate, or an optical semiconductor device includes a light emitting element and light receiving element on the same semiconductor substrate, or an optical semiconductor device includes a light emitting element and electrical circuit element on the same semiconductor substrate. A light absorbing layer, which prevents the leakage of light from the light emitting element, even when it is reflected at the electrodes, etc., from reaching the other light emitting element or light receiving element or electrical circuit element, is formed on the semiconductor substrate.

3 Claims, 8 Drawing Figures

OPTICAL SEMICONDUCTOR DEVICE

BACKGROUND OF THE INVENTION (1) Field of the Invention

The present invention relates to an optical semiconductor device, particularly to an optical semiconductor device including a combination of one or more optical semiconductor devices, or a combination of an optical semiconductor device and electrical circuit elements formed on a semiconductor substrate.

(2) Description of the Prior Art

A semiconductor laser element, which is an optical semiconductor device, usually has the structure shown in FIG. 1. In FIG. 1, 11 is an n-type InP substrate; 12 is an n-type InP buffer layer equivalently functioning as a clad layer; 13 is an active layer consisting of InGaAsP; 14 is a p-type InP clad layer; 15 is an insulating layer consisting of silicon dioxide ($SiO_2$); 16 is a p-side electrode; and 17 is an n-side electrode.

In such a semiconductor laser, the current injection region is a striped region defined by the insulating layer 15. A positive voltage is applied to the p-side electrode 16 while a negative voltage is applied to the n-side electrode 17, thereby the carrier is injected into the active layer 13, thus causing light to be emitted through recombination. The emitted light has a larger photon energy than the band gap energy of the active layer 13 and is combined within the active layer 13 which is sandwiched between the clad layers 12 and 14 which have a lower refractive index than the active layer 13.

However, the light, penetrating into the clad layers 12 and 14 and scattering at the interface between the active layer 13 and layers 12 and 14 (hereinafter referred to as leakage light), propagates through the InP clad layers 12 and 14. Since the band gap of InP is wider than that of InGaAsP of the active layer 13, the leakage light propagates within the InP crystal without any attenuation and then returns to the active layer 13 after it is reflected at the interface of crystals due to the Fresnel reflection effect of the electrodes 16 and 17, arranged on the elements. The returning light not only makes unstable oscillation of the pertinent semiconductor laser element but also spacially disturbs the light emitting pattern or makes the pattern unstable.

FIG. 2 shows the emitting light for a field pattern in a direction perpendicular to the junction of the crystal. The zig-zag portion indicates a disturbance of the emitting pattern generated when the returning light enters the active layer 13. The disturbance of the emitting light for the field pattern causes the coherence to be poor and causes, for example, deteriorated resolution during picture processing.

In a device containing semiconductor light emitting elements, optical semiconductor devices such as phototransistors, FET's or electrical circuit elements are formed on the same substrate. The leakage light or returning light from the semiconductor light emitting elements is captured as noise by the optical semiconductor elements and FET's or electrical circuit elements formed adjacent to each other on the same substrate, and makes the elements unstable.

For example, when configuring an optical integrated circuit by forming a semiconductor laser element and a Schottky barrier type field effect transistor element which drives the semiconductor laser element, on the same substrate, the leakage light from the active region of the semiconductor laser element reaches the channel region of the transistor element and causes generation of unwanted carriers in the channel region. The generation of unwanted carriers results in malfunction of the pertinent transistor element. This phenomenon becomes more distinct when the distance between the semiconductor laser element and transistor element becomes small, that is, when integration density becomes high.

Conventional optical integrated semiconductor devices provide a problem in that it is difficult to realize a high integration density because the characteristics of electronic devices deteriorate by the light emitted from an optical semiconductor device, such as a laser device, and moreover the phenomenon becomes more distinct when integration density is improved.

SUMMARY OF THE INVENTION

In view of improving the disadvantages of conventional optical semiconductor devices, the present invention is contemplated to provide an optical semiconductor device wherein the leakage light from the light emitting region of a semiconductor light emitting element is prevented from entering the semiconductor light emitting element or the operating region of other semiconductor elements formed on the same substrate along with the semiconductor light emitting element.

According to the present invention, there is provided an optical semiconductor device, wherein an optical semiconductor element and other optical semiconductor elements or electrical circuit elements are separately arranged on the semiconductor substrate and simultaneously, a light absorbing layer is arranged within the semiconductor substrate just below at least the optical semiconductor element or at least one of the other elements.

DESCRIPTION OF THE PREFERRED EMBODIMENTS

Figure 1:
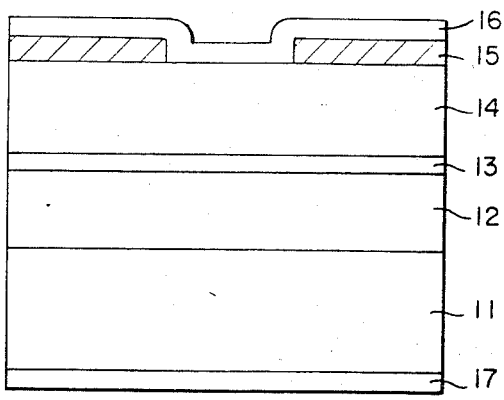
FIG. 1 is a sectional view of a conventional semiconductor laser device.
Figure 2:
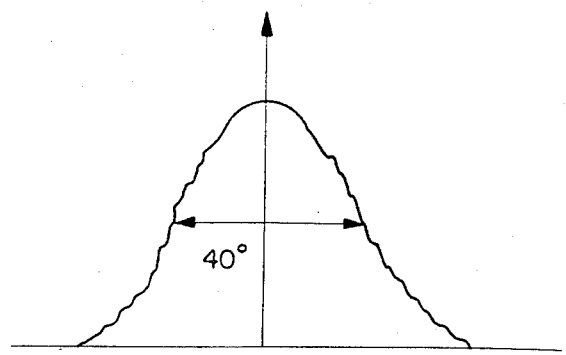
FIG. 2 is a field pattern distribution perpendicular to the junction plane of the conventional semiconductor laser device of FIG. 1.
Figure 3:
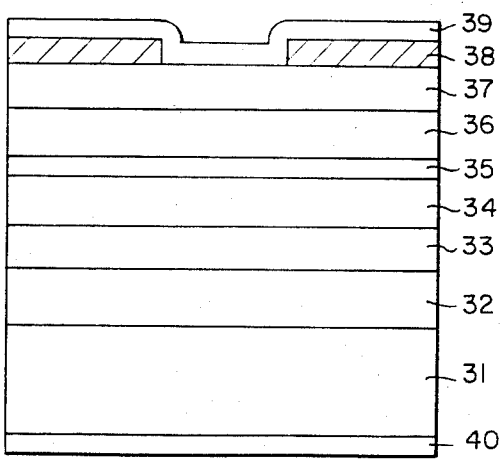
FIG. 3 is a sectional view of a semiconductor laser device which is an embodiment of an optical semiconductor device of the present invention.

FIG. 3 is a semiconductor laser device which is an embodiment of an optical semiconductor device of the present invention. In the semiconductor laser device, the buffer layer 32, comprising n-type indium/phosphide (InP), is formed having a thickness of about 5 μm on a substrate 31, comprising n-type indium/phosphide (InP), by means of a liquid phase epitaxial growth technique and/or vapor phase epitaxial growth technique and/or molecular beam epitaxial growth technique.

On the buffer layer 32, a first light absorbing layer 33 is formed. The first light absorbing layer 33 comprises an n-type indium/gallium/arsenide/phosphide (In-GaAsP) layer.

On the light absorbing layer 33, a first clad layer 34, comprising n-type indium/phosphide (InP), is formed having a thickness of about 1.5 μm, and on the first clad layer 34, an active layer 35, comprising indium/gallium/arsenide/phosphide (InGaAsP), is formed having a thickness of about 0.15 μm.

A second clad layer 36, comprising p-type indium/phosphide (InP), is formed having a thickness of about 1.5 μm, on the active layer 35 and the second light absorbing layer 37, comprising p-type indium/gallium/arsenide/phosphide (InGaAsP), is formed on the second clad layer 36.

On the second light absorbing layer 37, the insulating film 38, comprising silicon dioxide (SiO$_2$), is deposited. Deposited on the insulating film 38 is the electrode 39 comprising titanium/platinum/gold (TiPtAu). An electrode 40, comprising a gold/germanium (AuGe) layer and a nickel (Ni) layer, is deposited on the back surface of the substrate 31.

In the case where the emitted light has a wavelength of 1.3 μm, the active layer 35 comprises In$_{0.69}$Ga$_{0.31}$As$_{0.66}$P$_{0.34}$, and in the case where the wavelength at the absorbing edge is 1.4 μm the light absorbing layers 33 and 37 comprise In$_{0.63}$Ga$_{0.37}$As$_{0.78}$P$_{0.22}$.

When the wavelength of emitted light in the active layer 35 is 1.3 m in the semiconductor laser element, if the wavelength at the absorbing edge of the light absorbing layers 33 and 37 is set to 1.4 μm, the absorbing coefficient of the light absorbing layers 33 and 37 becomes $1 \times 10^4$ cm$^{-1}$.

When the incident light of the intensity I$_o$ passes through a semiconductor crystal having an absorbing coefficient α and a thickness d, the intensity of light passed in the semiconductor crystal is expressed as follows:

$$I = I_o e^{-\alpha d}$$

Therefore, when $\alpha d \geq 1$, the relation of $I \leq I_o \cdot e^{-1}$ can be obtained and an optical intensity of transmitted light can be greatly reduced. Therefore, setting the thickness of the light absorbing layers 33 and 37 to 1 μm satisfies the relation $\alpha d \geq 1$, and the reduction of leakage light intensity is more than 63% when the light passes the light absorbing layers 33 and 37, and more than 86% for a round-trip.

In the semiconductor device, a positive voltage is applied to the electrode 39 while a negative voltage is applied to the electrode 40. A current is applied only to the striped region of the insulating film 38 or the active layer 35 and a laser oscillation (light emission) can be realized through recombination in the active layer 35.

The light emitted is trapped within the active layer 35 by the effect of clad layers 34 and 36. Part of the light penetrates into the clad layers 34 and 36 or is dispersed from the active layer 35 as leakage light through scattering at the interface of the active layer 35 and clad layers 34 and 36. The leakage light propagates into the semiconductor layer which forms the semiconductor laser device.

However, since the light absorbing layers 33 and 37 are provided in the device of this embodiment, the leakage light propagating toward the electrodes 39 and 40 passes through the absorbing layers 33 and 37. When the leakage light has an intensity I$_o$, the intensity I of light having passed the light absorbing layers 33 and 37 becomes lower than $I_o \cdot e^{-1}$ ($I \leq I_o \cdot e^{-1}$) because of $\alpha d \leq 1$. The light passed in the light absorbing layers 33 and 37 changes to returning light due to the Fresnel reflection at the interface of crystals and reflection by the electrodes 39 and 40, and then again passes the light absorbing layers 33 and 37. As a result, the light, having passed the light absorbing layers 33 and 37, has the intensity I' ($\leq R \cdot I_o \cdot e^{-2}$, where R is the reflection coefficient and R < 1).

As explained above, the intensity of light returning to the active layer 35 can be reduced about one order or more by providing the light absorbing layers 33 and 37. As a result, oscillation, considered from the point of view of output power, can be stabilized, and the light emitting pattern can be prevented from being spacially disturbed and can be stabilized.

Figure 4:
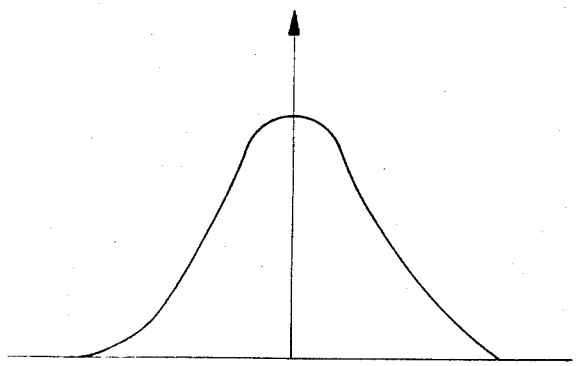
FIG. 4 is a field pattern distribution perpendicular to the junction plane of the semiconductor laser device of the present invention of FIG. 3.

FIG. 4 shows the light emitting field pattern perpendicular to the junction of a laser diode in the preferred embodiment. Since the amount of leakage light returning to the active layer 35 can be reduced by providing the light absorbing layers 33 and 37, the emitted light is not disturbed.

Figure 5:
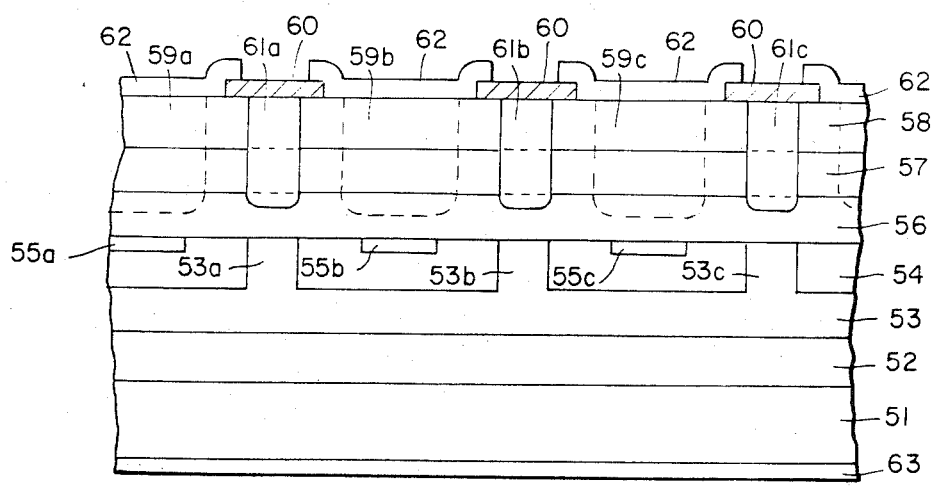
FIG. 5 is a sectional view of an optical semiconductor device in which a plurality of semiconductor laser devices are arranged on the same substrate, as an embodiment of an optical semiconductor device of the present invention.

FIG. 5 is another embodiment of the invention comprising an optical semiconductor device including a plurality of semiconductor laser devices formed in the form of an array on the same semiconductor substrate.

In the semiconductor device, the buffer layer 52, comprising n-type InP, is formed having a thickness of about 5 μm on a substrate 51 which comprises n-type InP. A first light absorbing layer 53 is formed on the buffer layer 52. The light absorbing layer 53 comprises an n-type InGaAsP layer having a thickness of about 2.5 μm.

On the light absorbing layer 53, a first clad layer 54, comprising n-type InP, is formed having a thickness of about 1.5 μm, and in the first clad layer 54, the active layers 55a, 55b, . . . comprising InGaAsP, are selectively formed having a thickness of about 0.15 μm.

A second clad layer 56 comprising p-type InP having a thickness of about 1.5 μm, is formed on the active layers 55a, 55b, . . . , and the first clad layer. A second light absorbing layer 57, comprising n-type InGaAsP, is formed on the second clad layer 56.

Then, a contact layer 58 comprising an n-type InGaAsP layer having a thickness of about 1 μm, is formed on the second light absorbing layer 57. The p-type current paths 59a, 59b, . . . are formed in the region corresponding to the active layers 55a, 55b, . . . , passing through the n-type InGaAsP contact layer 58 and the second light absorbing layer 57 and reaching the second clad layer 56. The p-type current paths 59a, 59b, . . . are formed by selectively introducing zinc (Zn) or cadmium (Cd).

The insulating layer 60 comprises silicon dioxide selectively deposited on the surface of the n-type InGaAsP contact layer 58 between the p-type current paths 59a, 59b, . . . High resistance regions 61a, 61b, . . . are formed below the insulating layer 60, passing through the n-type InGaAsP layer 58 and the second light absorbing layer 57 and reaching the second clad layer 56. Each of the active layers 55a, 55b, . . . is electrically separated. The high resistance regions 61a, 61b, . . . are formed by selectively implanting protons.

An electrode 62 is formed on the n-type InGaAsP layer 58, and the electrode 63 is formed on the back surface of the n-type InP substrate 51.

In the structure, the first light absorbing layer 53 is formed as protruding portions 53a, 53b, . . . coming in contact with the second clad layer 56 in the area corresponding to the high resistance regions 61a, 61b, . . . and formed between the active layers 55a, 55b, . . .

In the optical semiconductor device, the active layer 55 comprises $In_{0.69}Ga_{0.31}As_{0.66}P_{0.34}$ when the wavelength of emitted light is 1.3 μm, while the light absorbing layers 53 and 57 comprise $In_{0.63}Ga_{0.37}As_{0.78}P_{0.22}$ when the wavelength at the absorbing edge is 1.4 μm.

In the case of an optical semiconductor device having the above structure, the leakage light from the light emitting region of each semiconductor laser device and the light reflected from the electrodes 62 and 63 is absorbed by the light absorbing layers 53 and 57 and the amount of light penetrating into the light emitting regions is reduced. In addition, the leakage light which directly propagates to the other light emitting regions from the active region of the semiconductor laser device, is absorbed by the protruding portions 53a, 53b, . . . of the light absorbing layer 53 and less light penetrates into the other light emitting regions.

Figure 6:
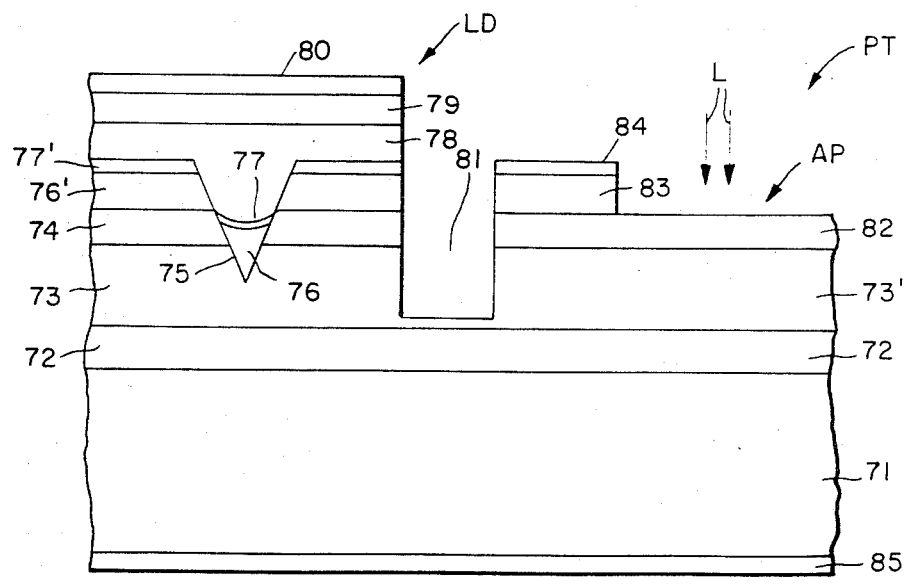
FIG. 6 is a sectional view of an integrated circuit element in which a semiconductor laser device and an optical sensing device are arranged on the same substrate, formed as an embodiment of a photo-semiconductor device of the present invention.

FIG. 6 is an optical semiconductor device of the present invention, including a semiconductor laser element LD and a phototransistor PT formed on the same semiconductor substrate.

In the optical semiconductor device of FIG. 6, the light absorbing layer 72 comprises an n-type InGaAsP layer having a thickness of about 1 μm formed on the substrate 71 which comprises n-type InP. An n-type InP layer 73 having a thickness of about 5 μm and a p-type InP layer 74 having a thickness of about 1 μm, are formed on the semiconductor laser element LD forming the region $A_L$ on the light absorbing layer 72.

In the V-shaped groove 75 provided, reaching to the n-type InP layer 73 from the p-type InP layer 74, the first clad layer 76 comprising n-type InP and the active layer 77 comprising InGaAsP, are formed. An n-type InP layer 76' and InGaAsP layer 77' are also formed on the p-type InP layer 74. A second clad layer 78 comprising p-type InP is formed on the active layer 77 in the groove 75 and the region on the InGaAsP layer 77'. On the second clad layer 78, an electrode 80 is deposited via the p-type InGaAsP layer 79, having a thickness of about 1 μm.

At the photo-transistor PT forming region $A_T$ which is separated from the semiconductor laser element region $A_L$ by the groove 81, passes through the p-type InP layer 74 and reaches the n-type InP layer 73. An emitter or collector of the phototransistor is formed by the n-type InP layer 73', a base of the photo-transistor is formed by the p-type InGaAsP layer 82 and a collector or emitter of the photo-transistor is formed by the n-type InP layer 83 which is selectively formed on the p-type InGaAsP layer 82. On the n-type InP layer 83, the electrode 84 is formed, while at the back surface of the substrate 71 which comprises n-type InP, an electrode 85 is formed.

In the device, a current flowing to the active layer 77 of the semiconductor laser element LD flows in a path sandwiched by the reverse bias junctions between the p-type InP layer 74 and the n-type InP 76' layer formed outside the V-shaped groove 75 and thereby flows effectively into the active layer 77.

Also, in the optical semiconductor device, a light signal L, received at a light receiving region $A_p$ of the photo-transistor PT, is converted to an electrical signal and is then amplified by the photo-transistor PT. The amplified signal drives the semiconductor laser element LD via the driving transistor element and thereby a light signal higher than the light signal L can be emitted from the semiconductor laser element LD. The driving transistor element can be formed monolithically on the semiconductor substrate.

Part of the output of the semiconductor laser element LD leaks out and is reflected at the electrode 85. When it is input to the photo-transistor PT, it appears as noise, but, since the light absorbing layer 72 is provided in this embodiment, the leakage light is sufficiently attenuated, thus reducing the noise level to the photo-transistor PT.

It is desirable that the groove 81 be formed having the same depth as the light absorbing layer 72. Leakage light into the semiconductor substrate from the semiconductor laser element LD, is effectively absorbed by the light absorbing layer 72.

In the above structure, the light absorbing layer 72 is not always required to be formed just below both the semiconductor laser element LD and the photo-transistor PT, it may be formed below any of the semiconductor laser elements LD or photo transistors PT as long as the thickness of the light absorbing layer 72 is large enough to absorb the leakage light. Moreover, the present invention, can be adapted effectively in the case where a photo-diode or avalanche-photo-diode is used in place of the photo-transistor as the light receiving element.

In the embodiment, the active layer 77 of the semiconductor laser element LD comprises $In_{0.69}Ga_{0.31}As_{0.66}P_{0.34}$ when the wavelength of light emitted is 1.3 μm, while the light absorbing layer 72 comprises $In_{0.63}Ga_{0.37}As_{0.78}P_{0.22}$ when the wavelength at the absorbing edge is 1.4 μm. Moreover, the composition of the InGaAsP layer 82 forming the base of the photo-transistor PT is selected so that the receiving wavelength becomes 1.3 to 1.67 μm.

The structure shown in FIG. 6 provides the same effect as the embodiment when the light absorbing layer comprises a plurality of layers and where the products of absorption coefficients and thickness of each layer is greater than or equal to 1.

Figure 7:
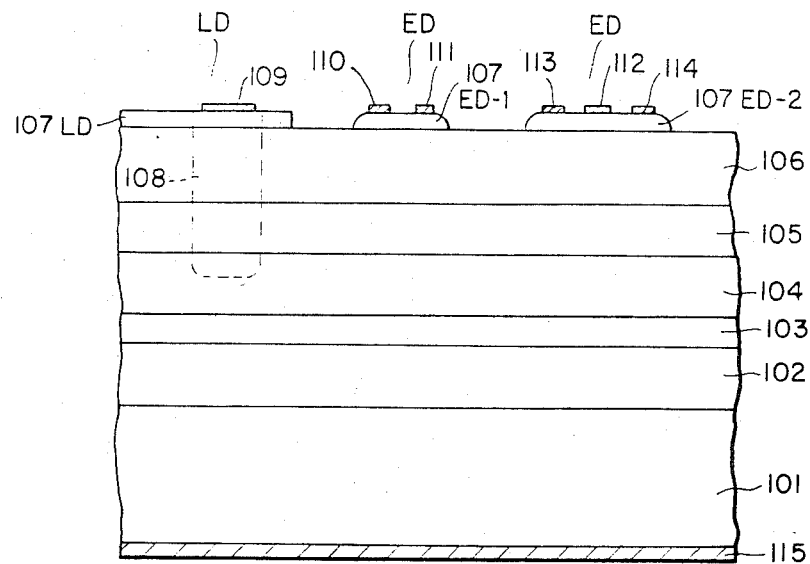
FIG. 7 is a sectional view of an optical integrated circuit device in which a semiconductor laser device and electrical circuit elements are arranged on the same substrate, formed as an embodiment of an optical semiconductor device of the present invention.

FIG. 7 shows a monolithically integrated device including a semiconductor laser element LD and electrical circuit elements ED for controlling the semiconductor laser element LD formed on the semiconductor substrate.

In the optical semiconductor device of FIG. 7, a buffer layer, which also functions as the clad layer 102, comprising an n-type GaAs layer having a thickness of about 1.5 μm, is formed on the n+-type GaAs substrate 101 which has a thickness of 100 μm. An active layer 103 comprising a $Ga_{1-x}Al_xAs$ ($0 \leq x \leq 1$) layer having a thickness of about 0.1 μm, is formed on the buffer layer 102. Then, a clad layer 104 comprising a p-type GaAlAs layer having a thickness of about 1.5 μm is formed on the active layer 103. A light absorbing layer 105 comprising $Ga_{1-y}Al_yAs$ ($0 \leq y \leq 1$) layer is formed on the clad layer 104.

On the light absorbing layer 105, an active layer 107, comprising an n-type GaAs layer having a thickness of about 0.2 μm, is selectively formed on a semi-insulating $Ga_{1-z}Al_zAs$ ($0 \leq z \leq 1$) layer 106 having a thickness of about 5 μm.

A p-type region 108 which includes the semi-insulating GaAl As layer 106, the light absorbing layer 105 and part of the p-type clad layer 104, is introduced into a portion of the region 107 LD where the semiconductor laser element LD is formed, and an electrode 109 is formed on the p-type region 108.

In addition, a Schottky contact electrode 110 and ohmic contact electrode 111 are deposited on the active layer 107 ED-1 on which the electrical circuit elements are arranged, thus forming a Schottky diode. A Schottky gate electrode 112, source electrode 113 and drain electrode 114 are deposited on the active layer 107 ED-2, thus forming a Schottky barrier type field effect transistor. An electrode 115 is deposited on the back surface of the n+-type GaAs substrate.

The light absorbing layer 105 may have a high resistance or insulating property. The semiconductor laser element LD is driven and controlled by electrical circuit elements ED in the optical semiconductor device. The active layer 103 comprises $Ga_{0.95}Al_{0.05}As$ when the wavelength of light is 0.85 μm, while the light absorbing layer 105 comprises $Ga_{0.98}Al_{0.02}As$ when the wavelength at the absorbing edge is 0.88 μm.

A part of the output light of the semiconductor laser element LD leaks and enters the electrical circuit elements ED, but is attenuated by the light absorbing layer 105 and does not reach the electrical circuit elements ED. Even if part of the light reaches the electrical circuit elements, it has a sufficiently low intensity, therefore no malfunction of the electrical circuit elements ED is caused. Accordingly, a thickness d of the light absorbing layer 105 is selected, as explained above, so that it satisfies the relation $\alpha d \geq 1$ with being the absorption coefficient. Since the light is absorbed in accordance with $\exp(-\alpha d)$, when $\alpha d = 1$, for example, the incident light is reduced to $1/e$ by absorption. Therefore, when $\alpha d \geq 1$, a greater part of incident light is absorbed and it is attenuated to $1/e$ or less. A thickness $d \geq 0.5$ μm satisfies the relation $\alpha d \geq 1$ when $\alpha = 2 \times 10^4$ cm$^{-1}$.

Meanwhile, the composition of the light absorbing layer 105 should be selected so that the concentration of aluminum (Al) becomes lower than or equal to ($x \geq y$) that of the active layer 103 of the semiconductor laser element LD. A crystal material having such a composition absorbs the light emitted from the active layer 103 in accordance with $\exp(-\alpha d)$. Therefore, the light does not reach the electrical circuit elements and no malfunction occurs.

Figure 8:
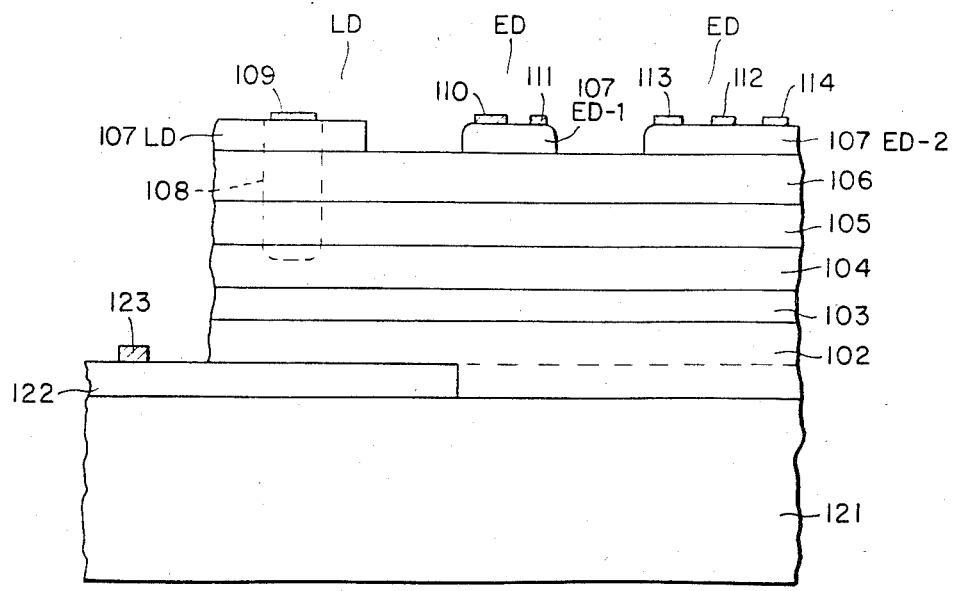
FIG. 8 is a sectional view of a modified optical integrated circuit device shown in FIG. 7.

FIG. 8 is an example of a modified optical semiconductor device of FIG. 7, as an embodiment of the optical semiconductor devices of the present invention. Therefore, the portions corresponding to those shown in FIG. 7 are given the same reference numbers and symbols as those used in FIG. 7.

In the optical semiconductor device shown in FIG. 8, a semi-insulating GaAs substrate 121 is used as the substrate. For this reason, an n+-type GaAs contact layer 122 is formed at least on the region corresponding to the area below the semiconductor laser element LD on the semi-insulating GaAs substrate 121 and an electrode 123 is deposited on the n+-type GaAs layer 122.

The active layer 107, on which electrical circuit elements ED are arranged, is formed using an InGaAsP or InGaAs crystal in order to realize an improved high speed operation of the electrical circuit elements ED in the optical semiconductor device shown in FIG. 8. The light absorbing layer 105 also comprises an InGaAsP crystal. Therefore the leakage light from the semiconductor laser element LD is prevented from reaching the electrical circuit elements ED.

When an InP semiconductor material is used in the optical semiconductor device shown in FIG. 7, the substrate 101 comprises an n+-type InP substrate, the n-type buffer layer/clad layer 102 comprises an n-type InP layer, the active layer 103 comprises an InGaAsP layer and the p-type clad layer 104 comprises a p-type InP layer. Moreover, the semi-insulating layer 106 comprises semi-insulating an InP or InGaAsP layer. In this case, the composition of the active layer and light absorbing layer are adequately selected in accordance with the wavelength of light emitted and at the absorbing edge. Use of the semi-insulating layer as the InGaAsP substrate also brings about the effect similar to that of the embodiment shown in FIG. 8.

In the embodiments shown in FIG. 7 and FIG. 8, only one light absorbing layer 105 is employed, but a similar effect can also be obtained by forming the light absorbing layer with a plurality of layers under the condition that the sum of the products of the absorbing coefficients and thickness at each layer is greater than or equal to 1.

Even if the semiconductor laser element and electrical circuit elements are arranged in parallel, unlike the vertical arrangement in the above embodiment, isolation of light can also be attained by employing light absorbing layers between the elements. Namely, isolation of light can be realized by inserting the light absorbing layer after electrically isolating between respective elements with a mesa type structure, etc. It should be noted that the effect of the present invention is not deteriorated at all even when the above inserted layer is composed not only of the crystal having a forbidden band narrower than that of the light emitting or light receiving region of the optical semiconductor element but also of a resin, plastic, metal, etc.

I claim:
1. An optical semiconductor device comprising:
    a semiconductor substrate having first and second sides;
    an electrode formed adjacent to the first side of said semiconductor substrate;
    a buffer layer formed adjacent to the second side of said semiconductor substrate;
    an active layer formed on said buffer layer;
    a clad layer formed on said active layer;
    a light absorbing layer formed on said clad layer;
    a semi-insulating layer formed on said light absorbing layer;
    active regions formed on said semi-insulating layer;
    a p-type region formed in a portion of said clad layer, light absorbing layer, semi-insulating layer and one of said active regions, for forming a laser element; and
    electrical circuit elements formed on said remaining active regions.

2. An optical semiconductor device in accordance with claim 1, further comprising a contact layer formed adjacent to the second side of said semiconductor substrate and under said p-type region, wherein said semiconductor substrate is a semi-insulating substrate.

3. An optical semiconductor device comprising:
- a semiconductor substrate having first and second sides;
- an electrode formed adjacent to the first side of said semiconductor substrate;
- a buffer layer formed adjacent to the second side of said semiconductor substrate;
- a first light absorbing layer formed on said buffer layer;
- a first clad layer formed in selected portions of said first light absorbing layer so that remaining portions of said first light absoring layer exist between said selected portions;
- active layers formed in said first clad layer;
- a second clad layer formed on said active layers, said first clad layer and said remaining portions of said first light absorbing layer;
- second light absorbing layer formed on said second clad layer;
- a contact layer formed on said second light absorbing layer;
- high resistance regions formed in portions of said contact layer, said second light absorbing layer and said second clad layer, and disposed above said remaining portions of said first light absorbing layer;
- current pads formed in portions of said contact layer, said second light absorbing layer, and said second clad layer, and disposed above said active layers;
- insulating layers formed on said high resistance regions; and
- electrodes formed on said current pads and covering portions of said insulating layer.

* * * * *

UNITED STATES PATENT AND TRADEMARK OFFICE
CERTIFICATE OF CORRECTION

PATENT NO. : 4,607,368
DATED : AUGUST 19, 1986
INVENTOR(S) : KEN-ICHI HORI

It is certified that error appears in the above-identified patent and that said Letters Patent is hereby corrected as shown below:

FRONT PAGE, [57] ABSTRACT, line 1, after "device" insert --, particularly an optical semiconductor device,--.

Col. 3, line 42, "m" should be --µm--.

Col. 6, line 63, "GaA As" should be --GaAlAs--.

Col. 9, line 17, "absoring" should be --absorbing--.

Col. 10, line 4, before "second" insert --a--.

Signed and Sealed this

Sixth Day of January, 1987

Attest:

DONALD J. QUIGG

Attesting Officer

Commissioner of Patents and Trademarks